United States Patent [19]

Cranston et al.

[11] E Re. 29,879

[45] Reissued Jan. 16, 1979

[54] METHOD OF FORMING A LAMINATE

[75] Inventors: Benjamin H. Cranston, Hamilton Township, Mercer County, N.J.; Carl F. Hornig, Kingston, N.H.; Donald A. Machusak, Hopewell Township, Mercer County, N.J.

[73] Assignee: Western Electric Company, Inc., New York, N.Y.

[21] Appl. No.: 838,442

[22] Filed: Sep. 30, 1977

Related U.S. Patent Documents

Reissue of:

[64] Patent No.: 3,998,374
Issued: Dec. 21, 1976
Appl. No.: 596,028
Filed: Jul. 11, 1975

[51] Int. Cl.[2] ..... H05K 3/24; B23K 28/00

[52] U.S. Cl. ..... 228/107; 228/180 R; 29/625; 83/53

[58] Field of Search ..... 228/2.5, 107, 108, 109, 228/179, 180; 29/421 E, 625; 83/53, 177

[56] References Cited

U.S. PATENT DOCUMENTS

| | | | |
|---|---|---|---|
| 2,732,897 | 1/1956 | Musser | 83/177 |
| 3,090,113 | 5/1963 | Karpovich | 83/53 X |
| 3,267,780 | 8/1966 | Roth | 83/53 X |
| 3,314,139 | 4/1967 | Whittaker et al. | 228/107 |
| 3,474,520 | 10/1969 | Takizawa et al. | 228/107 |
| 3,678,577 | 7/1972 | Weglin et al. | 29/625 |
| 3,736,654 | 6/1973 | Cranston | 228/109 |
| 3,813,758 | 6/1974 | Araki | 228/108 |

FOREIGN PATENT DOCUMENTS

| | | |
|---|---|---|
| 1160761 | 8/1969 | United Kingdom. |
| 1244088 | 8/1971 | United Kingdom. |

OTHER PUBLICATIONS

"Explosives from Space Age Shapes," Steel, Aug. 25, 1958.

*Primary Examiner*—Al Lawrence Smith
*Assistant Examiner*—K. J. Ramsey
*Attorney, Agent, or Firm*—Joel F. Spivak

[57] ABSTRACT

A method of forming a laminate is disclosed. The method comprises placing a metal film in juxtaposition to a surface to be joined thereto. A buffer medium having an explosive charge on at least one surface thereof is positioned proximate the film. The explosive charge is detonated to propel the film against the surface to shear a portion of the film, corresponding in shape to the surface, away from the buffer medium to bond the sheared portion to the surface.

8 Claims, 10 Drawing Figures

FIG. 1
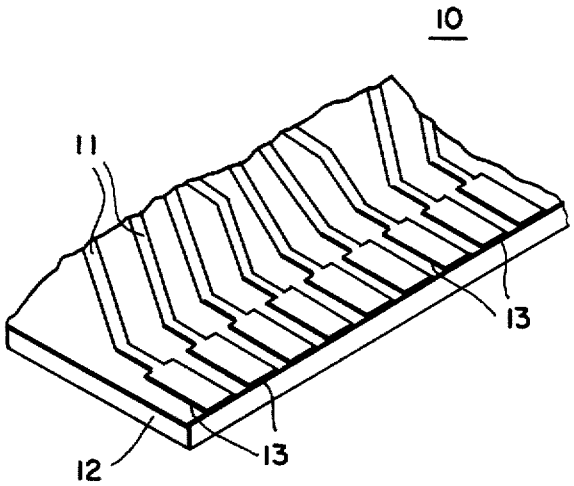
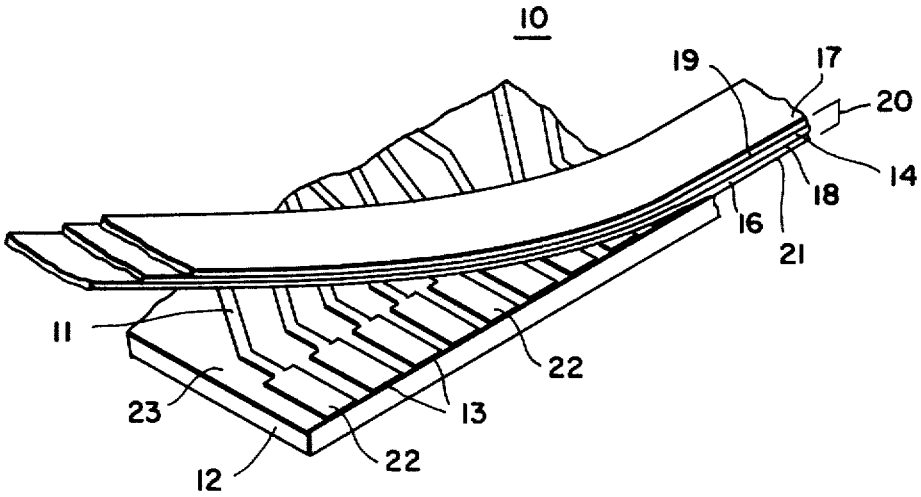
FIG. 2

FIG. 5
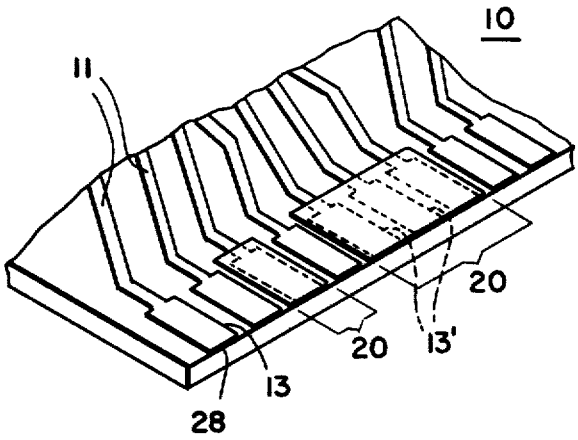
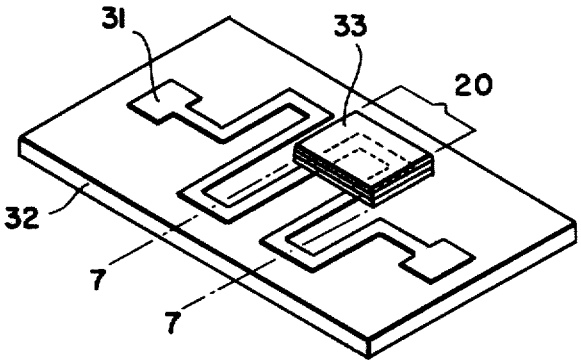
FIG. 6

FIG. 7
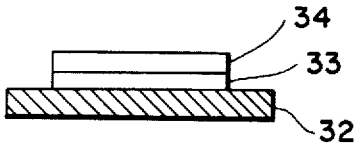
FIG. 8
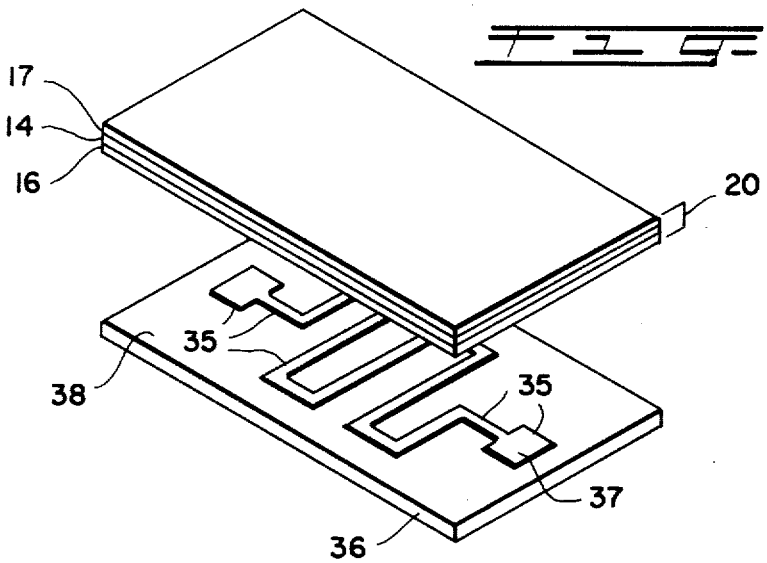
FIG. 9
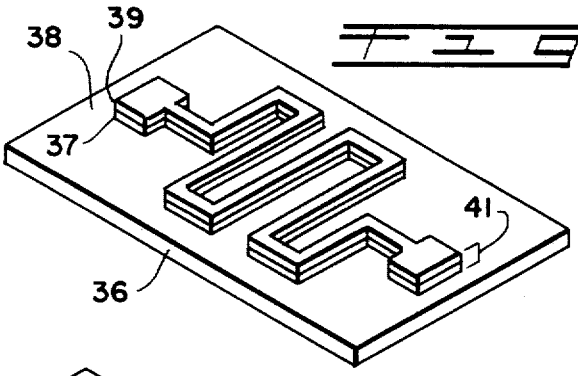
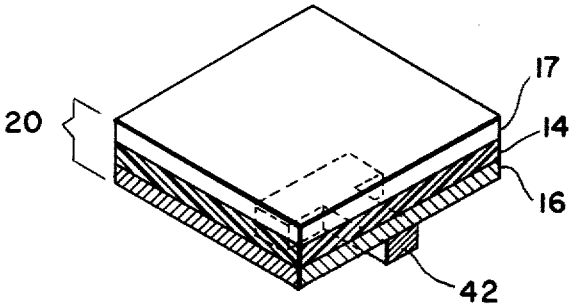
FIG. 10

METHOD OF FORMING A LAMINATE

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a method of forming a laminate and more particularly, to a method of forming a laminate by means of an explosive.

2. Description of the Prior Art

There are numerous industrial applications which require forming a pattern of metal-plated areas on an insulating substrate. One such application is in forming printed circuit boards. Often times when a printed circuit board is fabricated, defects occur in the formed metallic patterns which necessitate the repair of such defective patterns. Such repairs are often done by electroless and/or electroplating techniques or by solder bonding a shaped metal overlay to the defective pattern. However, these existing techniques are not practical and are costly and time consuming.

Selected portions of a metallic pattern, such as on a printed circuit board must often be coated with a different metal such as gold which is used for contact purposes. Again, such a coating has been accomplished by means of electroless and/or electroplating techniques which are costly and time consuming.

A method of forming a laminate which is rapid and does not require electroless and/or electroplating techniques is therefore desired. Explosive bonding techniques have been used for bonding one surface to another. In this regard, reference is made to U.S. Pat. No. 3,736,654 which discloses a method of explosively bonding a first workpiece to a second workpiece, and to U.S. Pat. No. 3,474,520 which reveals a process for explosively laminating a metal film to a base.

However, the methods of explosively bonding a metal film to a pattern have never been carried out without first shaping the metal film to conform to the pattern to which it is destined to be bonded. An explosive bonding method which eliminates this costly shaping step and the alignment associated therewith is therefore needed.

SUMMARY OF THE INVENTION

This invention relates to a method of forming a laminate and more particularly, to a method of forming a laminate by means of an explosive.

The method comprises placing a metal film in juxtaposition to a surface to be joined thereto. A buffer medium, having an explosive charge on at least one surface thereof, is positioned proximate the film. The explosive charge is detonated to propel the film against the surface to shear at least a portion of the film, corresponding in shape to the surface, away from the buffer medium to bond the sheared portion to the surface.

DESCRIPTION OF THE DRAWINGS

The present invention will be more readily understood by reference to the following drawing taken in conjunction with the detailed description, wherein:

FIG. 1 is a partial isometric view of a portion of a printed circuit board having a conductive pattern thereon;

FIG. 2 is a partial isometric view of the circuit board of FIG. 1 having an explosive laminate placed in a proximate position to the conductive pattern;

FIG. 5 is a partial isometric view of the printed circuit board of FIG. 1 wherein the explosive laminate is placed proximate selected conductive areas thereof;

FIG. 6 is an isometric view of a conductive pattern on an insulative substrate which has an explosive laminate on a portion of the pattern;

FIG. 7 is a plane view of the conductive pattern taken along lines 7—7 of FIG. 6;

FIG. 8 is an isometric view of a base having an upraised pattern thereon to which an explosive laminate is placed in a proximate position thereto;

FIG. 9 is an isometric view of the base of FIG. 8 which has been explosively laminated with a metal film; and FIG. 10 is an isometric view of a shaped base having an explosive laminate positioned proximate thereto.

DETAILED DESCRIPTION

Figure 3:
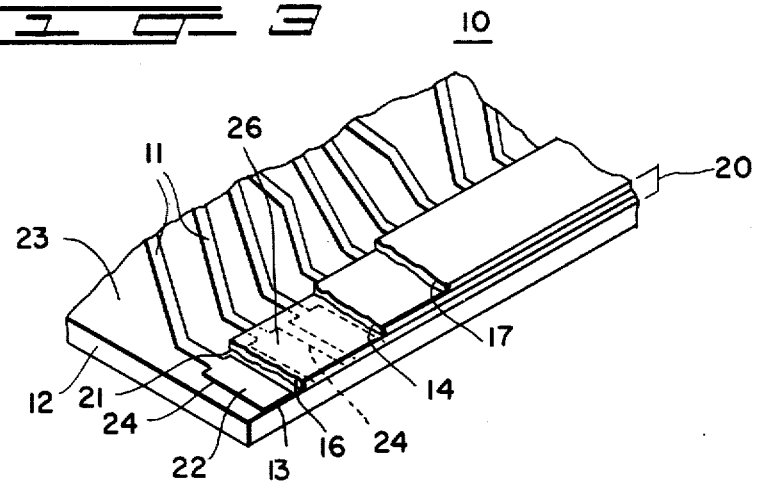
FIG. 3 is a partial isometric view of the printed circuit board of FIG. 2 where the explosive laminate is placed in juxtaposition to the conductive pattern of the printed circuit.

The present invention has been described largely in terms of bonding a gold film or layer (lamina) to a copper pattern of a printed circuit board to form a laminar structure. However, it will be understood that such description is for purposes of exposition and not for purposes of limitation. It will be readily appreciated that the inventive concept described is equally applicable to bonding any metal film to another film or pattern, metal or non-metal, conductive or non-conductive, whether or not such pattern is functionally a part of a printed circuit.

With reference to FIG. 1, there is shown a portion of a typical printed circuit board 10 having a conductive pattern 11, e.g., a copper pattern, on a base 12. Base 12 comprises a dielectric material such as an organic polymer, e.g., an epoxy, an epoxy polyester, a polyimide, polyethyleneterephthalate, a ceramic, etc. Pattern 11 has end portions or terminations 13 which are destined to be coated, for connection purposes to the board 10, with a metal deposit to form a laminate.

Referring to FIG. 2, a suitable buffer medium 14 is selected. A suitable buffer medium 14 is one which is compatible to both an explosive material and a metal film with which it is destined to be contacted. Such compatibility of buffer medium 14 includes the capability of holding or maintaining the metal film in a desired fashion and the property of being safe from breakdown due to a pressure disturbance upon detonation of the explosive material. Some suitable buffer media include thin plates of metals, e.g., stainless steel, and plates of organic polymers such a polyvinyl chloride, polyethyleneterephthalate, acrylic resins, etc., elastomeric tapes, e.g., neoprene rubber tape, polysulfide tape. A particularly suitable medium 14 comprises a polyimide such as the polyimide sold under the registered trademark "KAPTON," of the E. I. DuPont de Nemours Co.

Medium 14 should be of a sufficient size and thickness to support both an explosive charge or layer and the metallic film or foil, destined to be applied or deposited on opposed surfaces thereof, while not so thick as to deleteriously detract from the velocity of impact or the energy available at the interface between the supported metal film and a second surface to which the film is destined to be bonded. A metal film or layer 16 comprising a desired metal, e.g., gold, is applied to surface 18 of medium 14 by means of any conventional adhesive (not shown) which will temporarily hold film 16 to surface 18. The adhesive employed should be one which forms a bond to film 16 which is relatively weaker than a bond destined to be formed between film 16 and a surface to which film 16 is to be explosively propelled towards and against. Typical adhesives include silicone and acrylic adhesives. Alternatively, film 16 may be chemically deposited on surface 18 by any conventional means such as vapor depositing, electroless plating, etc., whereby an adhesive would be unnecessary. The thickness of film 16 is dependent upon the bonding application. For bonding to printed circuit patterns, film 16 typically ranges from about 0.2 to about 0.6 mils thick. An explosive charge or layer 17 is applied to surface 19 of medium 14 by any conventional means such as squeegeeing, screening, printing, etc., or as generally described in U.S. Pat. No. 3,736,654, assigned to the assignee hereof and incorporated by reference hereinto.

Explosive charge or layer 17 comprises a suitable primary high explosive composition. For purposes of the present invention, the term "high explosive" is defined as a chemical substance which undergoes a complex, high velocity exothermic reaction, typically having a detonation velocity of from 5,000 f.p.s. to 25,000 f.p.s. and thus exhibiting detonation as opposed to burning or deflagration. A "primary high explosive" or primary explosive, as compared to a "secondary high explosive," is one which may be easily detonated by the application thereto of an electrical discharge, heat, light, pressure, etc., has an extremely low critical mass for detonation, and is basically a very sensitive material.

Typical suitable explosives are disclosed in U.S. Pat. No. 3,736,654, which has been incorporated by reference hereinto, and include azides of silver, titanium, boron, silicon, copper, cadmium, ammonium and mercury ("-ic" and "-ous"); fulminates of mercury ("-ic" and "-ous"), silver and copper, acetylides of mercury ("-ic" and "-ous"), copper and silver; styphnates of lead and barium; silver nitride, tetrazene and diazodinitrophenol. A particularly useful primary explosive comprises lead azide, which may be used in a finely divided form such as the forms referred to as dextrinated or colloidal. Suitable lead azide compositions are disclosed in U.S. Pat. No. 3,704,186, assigned to the assignee hereof and incorporated by reference hereinto.

The amount of explosive employed, and therefore the thickness of explosive layer 17, is dependent upon (1) the materials to be bonded, (2) the thickness of these materials, (3) the particular explosive selected and its detonation velocity and mass, and (4) the nominal spacing between the surfaces destined to be bonded. These parameters determine the velocity of impact between surface 21 of film 16 destined to be contacted with and bonded to surface 22 of portions 13 upon detonation of explosive layer 17. In order to obtain a good, metallurgical bond, the velocity of impact between surfaces 21 and 22 must be sufficient to create an impact pressure which causes substantial plastic flow to occur within the materials being bonded. The superficial plastic flow deforms the respective contacting surfaces (21, 22), resulting in a jet comprising material from at least one and preferably both contacted surfaces to spurt out therebetween. This "jetting" phenomenon is important to establishing a strong metallurgical bond, i.e., a wide area intimate union between two metallic materials in which metallic bonding forces extend across the interface therebetween, since it removes impurities and oxides which are present on the respective surfaces and brings freshly exposed, virgin material into intimate contact to bond.

As stated above, a suitable velocity of impact is dependent upon the explosive employed, including the amount and/or layer thickness thereof, the materials to be bonded, and the spatial relationship between the material surfaces, i.e., upon parameters which can be easily determined by one skilled in the art in the light of the subject disclosure without an undue amount of experimentation. In this regard, it is to be noted that a suitable impact pressure sufficient to obtain a desirable jetting and good metallurgical bond can be easily determined or calculated by one skilled in the art, as indicated in U.S. Pat. No. 3,736,654, incorporated hereinto by reference.

Explosive layer 17 is illustrated in FIG. 2 as being of generally uniform thickness over surface 19 of medium 14, but it is to be understood that this is for illustrative purposes only. Discrete explosive charges or layers corresponding to each end portion 13 may also be employed and these discrete charges need not be patterned to conform to portions 13. All that is required is that a sufficiently large bonding force be created to accelerate film 16 toward portions 13 and obtain a suitable velocity of impact therebetween.

When film 16 and layer 17 are applied to or deposited on medium 14, an explosive laminate 20 is thus formed. Laminate 20 is placed in a desired spatial relationship with end portions or terminations 13 of printed circuit board 10. Explosive laminate 20 is positioned and supported in a desired spatial relationship, e.g., film 16 is either parallel to or angled to end portions 13, and sufficiently spaced apart therefrom. The spacing of bottom surface 21 of film 16 from surface 22 of portions 13 should be such as to insure an adequate bond therebetween, when explosive layer 17 destined to be detonated is actually detonated, without bonding of film 16 to dielectric surface 23 of base 12. Where base 12 comprises a polymeric material such as a polyimide, an epoxy, a polyester, etc., there is typically no bonding between film 16 and surface 23. In most instances it has not been found necessary to provide a gap or spacing between surfaces 21 and 22, through which gap film 16 is accelerated to form an explosive bond with portions 13 of pattern 11. In such cases, surface 21 of film 16 is typically placed into contact with surface 22 of portion 13 and it is believed that the "hills" and "valleys" in surfaces 21 and 22 provide sufficient space through which film 16 can be sufficiently accelerated to provide a high quality bond upon the subsequent detonation of explosive layer 17. However, where base 12 comprises a ceramic or glass, for example, a bond between film 16 and surface 23 can occur, depending upon both the nature of the dielectric material comprising base 12 and the metal comprising layer 16. In such a situation where bonding to surface 23 can possibly occur and is not desired, a second buffer material (not shown) is inserted between surfaces 21 and 23 whereby only bonding between surfaces 21 and 22 occurs.

Figure 4:
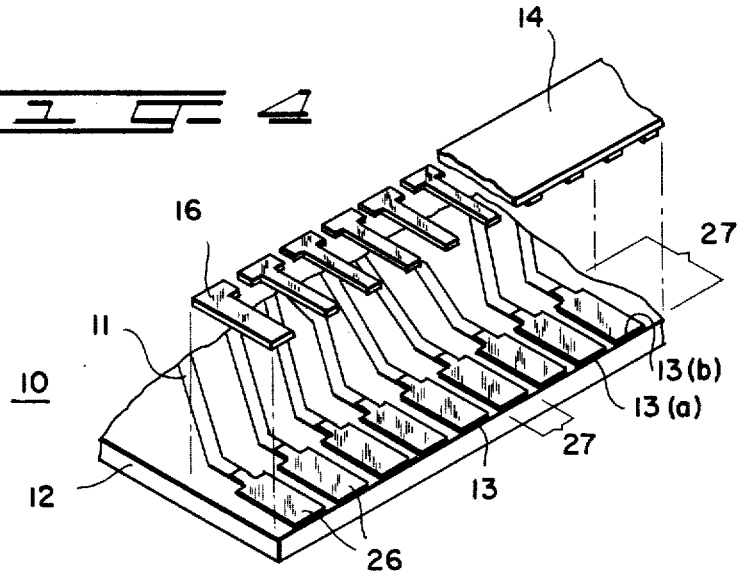
FIG. 4 is a partial isometric view of the printed circuit of FIG. 3 after the explosive laminate has been detonated and a portion of a metal film contained thereon is bonded to the conductive pattern of the printed circuit board.

Referring to FIGS. 2 and 3, explosive layer 17 is detonated by any conventional means, including but not restricted to the application of an electrical discharge, heat, light, laser and acoustic energy. Upon detonation of layer 17, film 16 is driven towards portions 13 with a velocity sufficient to contact surface 21 to surface 22. Upon contact, edges 24 of portions 13 act to shear portions 26 of film 16, corresponding in shape to end portions or terminations 13, away from buffer medium 14 and the thus sheared portions 26 form a metallurgical bond to surface 22 of portions 13 as illustrated in FIG. 4. This shearing and bonding is a surprising and unexpected result. Because of the shearing effect, film 16 does not have to be shaped to conform to portions 13 prior to being put on buffer medium 14. All that is required is that the surface area of film 16 be large enough to cover the shaped surface, i.e., portions 13, to which it is destined to be bonded to form a laminate.

It is to be noted and stressed hereat that the amount of explosive material in layer 17 should be sufficient to transmit sufficient energy through a buffer 14, having a particular thickness, to drive film 16, having a particular thickness, towards surface 22 of portion 13, having a particular thickness, with a velocity sufficient to create a high-impact pressure. The high-impact pressure thus created should be sufficient to cause jetting and the formation of a metallurgical bond as well as causing the shearing effect, described above, by edges 24 of terminations 13, having a particular thickness. And, all of the foregoing has to occur without bonding to surface 23 of base 12. Therefore the creation of a metallurigcal bond with the shearing effect is dependent upon the amount of explosive employed, i.e., the thickness of explosive layer 17 and the height of the shearing edges of the surface being bonded, that is the thickness of portion 13, for a particular buffer medium 14 and metal film 16. Such parameters of amount of explosive and shearing edge height, are known or are easily ascertainable experimentally by one skilled in the art in the light of the subject disclosure. Typically, for example, it has been found that when using a 3 to 8 mil thick layer 17 of an explosive mixture, comprising when wet a 70 weight percent colloidal lead azide ($PbN_6$) and 30 weight percent screening medium (a pine oil-ethyl cellulose blend comprising approximately 10% by weight ethyl cellulose), screened on a 2.5 mils thick polyimide buffer 14 having a metal film 16, ranging from about 0.2 to about 0.6 mil thick, a metal pattern, that is terminations 13, having a thickness of at least 1.5 mils, will shear a mating portion of the film 16 and be bonded thereto with a metallurgical bond.

Also surprising is the fact that the sheared portion 26 separates or delaminates from medium 14 without employing a stripping operation in which buffer medium 14 has to be peeled with an expenditure of some force.

As shown in FIG. 4, a laminate 27 is obtained comprising a shaped end portion or termination having a first layer 13(a), e.g., a copper layer, gold layer, nickel layer, alloys such as Sn-Ni, etc., and a second layer 13(b), e.g., a gold layer.

Portions 13 may comprise a single layer, e.g., Cu, or may already exist as a laminate, i.e., have a metal deposit, e.g., Au, thereover. Another discrete layer or laminae can then be deposited using explosive laminate 20 as described above. Referring to FIG. 5, where pattern 11, e.g., a copper pattern, has been selectively electroplated, e.g., gold plated, with a layer of gold 28, on portions 13, at least one portion 13' may be defectively plated and may require repair. To accomplish the repair at least one explosive laminate 20 is placed in a desired spatial relationship to defective portion 13' to be repaired. Explosive laminate 20 is of a configuration whereby metal film 16 (FIG. 3) [the individual films and layers of laminate 20 are not shown in FIG. 5 for simplicity purposes only] thereof will only contact portion 13' to be repaired. Explosive layer 17 is detonated as described above and a repair laminae comprising the sheared portion of film 16 is bonded to defective portion 13'.

Although an end portion or termination of a pattern has been explosively laminated, any discrete section of a pattern can be so laminated. Referring to FIG. 6, a conductive pattern 31, e.g., a copper pattern, on a suitable base 32, e.g., a ceramic base, has a discrete portion 33 which is desired to be bonded to a shaped metal film, e.g., a gold film. Explosive laminate 20 is suitably placed in relationship with portion 33 and detonated whereby the edges of portion 33 shear a portion 34 of film 16 corresponding in shape thereto and sheared portion 34 is bonded to portion 33 to form a laminar structure as shown in FIG. 7.

In another embodiment of my invention, a desired printed circuit board may be explosively formed using an explosive laminate as described above. Referring to FIG. 8, a suitable dielectric base 36, such as a ceramic base, e.g., alumina, or a refractory base, e.g., BN, is selected. Base 36 is provided with at least one raised portion 37, e.g., about 1.5 mils thick, in a desired pattern destined to be metallized. Explosive laminate 20 is placed in a desired spatial relationship whereby metal film 16 thereof, upon subsequent detonation of layer 17, will be bonded only to portion 37 and not to surface 38 of base 36. Layer 17 is detonated and film 16 is propelled toward and against raised portion 37 whereby the edges 35 thereof shear a portion 39 of film 17, corresponding in shape to portion 37, and the thus sheared portion is bonded to portion 37 to form a conductive laminate 41 as shown in FIG. 9.

FIG. 10 illustrates yet another embodiment of my invention. A suitable base 42 is selected, e.g., a ceramic base, a refractory base, a highly polished metal base having no "hills or valleys" for satisfactory bonding thereto, etc. Base 42 is shaped in a pattern desired for a metal pattern. For simplicity and ease of illustration, base 42 is in a T-shape. Explosive laminate 20 is suitably situated with respect to base 42 so that upon detonation of layer 17, film 16 will be sheared in the shape of base 42 but will not be essentially permanently bonded thereto. Layer 17 of laminate 20 is detonated and the surprising shear effect occurs whereby film 16 is sheared in the shape of base 42 and is easily separated therefrom to form a discrete, shaped metal article. It is, of course, understood that laminate 20 may be spaced from base 42 to achieve the desired shearing without bonding. Such spacing may be easily determined by one skilled in the art in view of the subject disclosre.

EXAMPLE I

An epoxy printed circuit board having a conductive copper pattern of about 1.5 mils thick with tab terminations was selected. The top terminations had physical dimensions of 100 mils long by 300 mils wide. An explosive laminate was formed comprising a 3 mils thick explosive layer of an explosive mixture of about 70 weight percent colloidal lead azide ($PbN_6$) and 30 weight percent of a screening medium comprising a pine oil-ethyl cellulose blend of about 10% by weight ethyl cellulose. The explosive mixture was first screened on a first surface of a 1.0 mil thick polyimide buffer medium (film), commercially obtained. The buffer medium had a metal laminate layer held on the surface opposed to the first surface by means of a 1.5 mils thick silicone polymer adhesive layer. The metal laminate comprised a 0.1 mil thick Au layer contacting the adhesive and a 0.4 mil thick Ni layer. The dimensions of the explosive layer, the buffer medium and the metal layer were in excess of the length and width of the tab terminations. The metal layer of the resultant explosive laminate was placed in contact with the tab terminations and the explosive layer was detonated. Portions of the metal layer conforming in shape to the tab terminations were sheared by the tab terminations from the buffer medium and bonded to the tab terminations. The buffer medium separated from the thus sheared portions. A conventional adhesive tape peel test was carried out and the resultant laminate was not delaminated.

EXAMPLE II

The procedure of Example I was repeated except that the copper tab terminations were first electroplated with a gold film 100 micro-inches thick. Substantially the same results were obtained.

EXAMPLE III

The procedure of Example I was repeated except that the copper conductor pattern and tab terminations were about 2.0 mils thick. The explosive laminate comprised about a 7 mils thick explosive layer on the polyimide buffer film which had a 0.2 mil thick nickel film on the surface opposed the explosive layer. Substantially the same results were obtained.

It is to be understood that the above-described embodiments are simply illustrative of the principles of the invention. Various other modifications and changes may be made by those skilled in the art which will embody the principles of the invention and fall within the spirit and scope thereof.

We claim:

1. A method of forming a laminate, which comprises:
   a. placing a metal film in juxtaposition to a first surface to be joined thereto;
   b. positioning a *planar* buffer medium proximate said film, said buffer medium having an explosive charge on at least one surface thereof; and
   c. detonating said explosive charge to propel said film against an edge of said first surface to shear at least a portion of said film from the remainder thereof, corresponding in shape to said first surface, to bond said sheared portion to said first surface.

2. A method of depositing a metal on a discrete portion of a metal pattern, which comprises:
   a. placing a metal film in juxtaposition to the portion;
   b. positioning a *planar* buffer medium proximate said film, said buffer medium having an explosive charge deposited on at least one surface thereof; and
   c. detonating said explosive charge to propel said film against the discrete portion to shear a portion of said film from the remainder thereof, conforming in shape to the discrete portion, to bond said sheared portion only to the discrete portion.

3. A method of forming a printed circuit, which comprises:
   a. forming a dielectric layer having at least one raised portion thereof delineating a pattern corresponding to a desired conductive pattern;
   b. placing a metal film in juxtaposition to said layer;
   c. positioning a buffer medium proximate said film, said buffer medium having an explosive charge deposited on at least a surface thereof; and
   d. detonating said explosive charge to propel said film against said layer to shear at least one portion of said film from the remainder thereof, corresponding to said delineated pattern, and to bond said sheared portion to said at least one raised portion.

4. A method of repairing a printed circuit pattern, which comprises:
   a. placing a metal film in juxtaposition to a portion of the printed circuit pattern to be repaired;
   b. positioning a buffer medium proximate said film, said buffer medium having an explosive charge deposited on at least a surface thereof; and
   c. detonating said explosive charge to propel said film against said portion to at least shear said film in a pattern corresponding to said portion to bond said sheared pattern to said portion to repair said portion.

[5. A method of forming a metallic pattern, which comprises:
   a. placing a metal film in juxtaposition to a surface having a desired shape;
   b. positioning a buffer medium proximate said film, said buffer medium having an explosive charge deposited on at least a surface thereof; and
   c. detonating said explosive charge to propel said film against an edge of said surface at a velocity sufficient to at least shear said film in a pattern corresponding to said surface without achieving a bond to said surface.]

*6. The method of forming a laminate as recited in claim 1 wherein:*
   *(a) said metal film is from 0.2 to 0.6 mil thick; and*
   *(b) said buffer medium has an explosive charge on one surface thereof and said metal film on the opposite surface thereof.*

*7. The method of forming a laminate as recited in claim 6 wherein upon detonation said buffer medium separates from said sheared portions of said metal film.*

*8. The method of positioning a metal on a discrete portion of metal pattern as recited in claim 2 wherein:*
   *(a) said metal film is from 0.2 to 0.6 mil thick; and*
   *(b) said buffer medium has an explosive charge on one surface thereof and said film on the opposite surface thereof.*

*9. The method of forming a laminate as recited in claim 8 wherein upon detonation said buffer medium separates from said sheared portions of said metal film.*

* * * * *